(12) United States Patent
Tang

(10) Patent No.: US 12,439,778 B2
(45) Date of Patent: Oct. 7, 2025

(54) OLED DISPLAY PANEL AND MANUFACTURING METHOD THEREOF

(71) Applicant: SHENZHEN CHINA STAR OPTOELECTRONICS SEMICONDUCTOR DISPLAY TECHNOLOGY CO., LTD., Shenzhen (CN)

(72) Inventor: Jia Tang, Shenzhen (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 17/771,651

(22) PCT Filed: Apr. 22, 2022

(86) PCT No.: PCT/CN2022/088407
§ 371 (c)(1),
(2) Date: Apr. 25, 2022

(87) PCT Pub. No.: WO2023/197354
PCT Pub. Date: Oct. 19, 2023

(65) Prior Publication Data
US 2024/0244895 A1    Jul. 18, 2024

(30) Foreign Application Priority Data

Apr. 12, 2022   (CN) .......................... 202210382743.4

(51) Int. Cl.
*H10K 59/124* (2023.01)
*H10K 59/12* (2023.01)
(Continued)

(52) U.S. Cl.
CPC ....... *H10K 59/124* (2023.02); *H10K 59/1201* (2023.02); *H10K 59/122* (2023.02);
(Continued)

(58) Field of Classification Search
None
See application file for complete search history.

(56) References Cited

U.S. PATENT DOCUMENTS

2007/0177069 A1* 8/2007 Lee ..................... H10K 59/8722
349/56
2014/0315339 A1* 10/2014 Kim ..................... H10K 71/621
438/34
(Continued)

FOREIGN PATENT DOCUMENTS

| CN | 103545457 A | 1/2014 |
|----|-------------|--------|
| CN | 104810382 A | 7/2015 |

(Continued)

OTHER PUBLICATIONS

PCT International Search Report for International Application No. PCT/CN2022/088407, mailed on Dec. 22, 2022, 10pp.
(Continued)

*Primary Examiner* — Nicholas J Tobergte
(74) *Attorney, Agent, or Firm* — The Roy Gross Law Firm, LLC; Roy D. Gross

(57) ABSTRACT

Embodiments of the present application disclose an OLED display panel and a method of manufacturing an OLED display panel. The OLED display panel includes an array substrate and a multi-functional layer disposed on the array substrate. The multi-functional layer includes a plurality of conductive portions disposed at intervals and non-conductive portions. One end of the conductive portions is electrically connected to a light emitting layer, and the other end of the conductive portions is electrically connected to a
(Continued)

source. The conductive portions and the non-conductive portions are located at a same layer, are coplanar, and are manufactured in a single process. This can reduce at least one mask, and the cost is lowered.

20 Claims, 3 Drawing Sheets

(51) Int. Cl.
  *H10K 59/122* (2023.01)
  *H10K 59/131* (2023.01)
  *H10K 59/38* (2023.01)
  *H10K 59/80* (2023.01)

(52) U.S. Cl.
  CPC ........... *H10K 59/131* (2023.02); *H10K 59/38* (2023.02); *H10K 59/878* (2023.02)

(56) References Cited

U.S. PATENT DOCUMENTS

| | | | | |
|---|---|---|---|---|
| 2016/0036005 | A1* | 2/2016 | Qi | H10K 59/122 257/40 |
| 2016/0043152 | A1* | 2/2016 | Tian | H10K 59/123 257/27 |
| 2019/0157629 | A1* | 5/2019 | Wang | H10K 50/865 |
| 2019/0355763 | A1* | 11/2019 | Chen | H01L 27/1218 |
| 2020/0350375 | A1* | 11/2020 | Zhu | H10K 59/1213 |

FOREIGN PATENT DOCUMENTS

| | | |
|---|---|---|
| CN | 108281574 A | 7/2018 |
| CN | 109166865 A | 1/2019 |
| CN | 110993642 A | 4/2020 |
| CN | 111180466 A | 5/2020 |
| CN | 113053974 A | 6/2021 |

OTHER PUBLICATIONS

PCT Written Opinion of the International Search Authority for International Application No. PCT/CN2022/088407, mailed on Dec. 22, 2022, 10pp.

Chinese Office Action issued in corresponding Chinese Patent Application No. 202210382743.4 dated Apr. 30, 2025, pp. 1-7, 16pp.

* cited by examiner

OLED DISPLAY PANEL AND MANUFACTURING METHOD THEREOF

CROSS REFERENCE TO RELATED APPLICATIONS

This application is a National Phase of PCT Patent Application No. PCT/CN2022/088407 having International filing date of Apr. 22, 2022, which claims the benefit of priority of Chinese Patent Application No. 202210382743.4, filed Apr. 12, 2022, the contents of which are all incorporated herein by reference in their entirety.

FIELD OF THE DISCLOSURE

The present application relates to organic light emitting diode (OLED) display technologies, and more particularly to an OLED display panel and a method of manufacturing an OLED display panel.

DESCRIPTION OF RELATED ARTS

Existing OLED display panels need to employ different masks to separately manufacture a flattening layer and an anode on an array substrate. The number of the masks is large, and the cost is high.

Technical Problems

Therefore, the technical problems in the existing OLED display panels are that a large number of masks are needed and the cost is high.

Technical Solutions

Embodiments of the present application provides an OLED display panel and a method of manufacturing an OLED display panel, which can alleviate the problems that the existing OLED display panels have a large number of masks and are high in cost.

Embodiments of the present application provide an OLED display panel, including:
  array substrate, including a source and a drain that are disposed at a same layer;
  a multi-functional layer, disposed above the array substrate;
  a light emitting layer, disposed at a side of the multi-functional layer away from the array substrate; and
  a cathode, disposed at a side of the light emitting layer away from the array substrate,
  wherein the multi-functional layer includes a plurality of conductive portions disposed at intervals and non-conductive portions, one end of the conductive portions is electrically connected to the light emitting layer, and the other end of the conductive portions is electrically connected to the source.

Optionally, in some embodiments of the present application, the conductive portions and the non-conductive portions are disposed at a same layer.

Optionally, in some embodiments of the present application, the material of the multi-functional layer includes a multi-functional material, and wherein under a first condition, the multi-functional layer is an insulating material, and under a second condition, the multi-functional layer is conductive after reacting with a first solution.

Optionally, in some embodiments of the present application, the first condition is room temperature under one atmosphere of pressure, and the multi-functional material is an insulating material in normal state.

Optionally, in some embodiments of the present application, the material of the multi-functional material includes a multi-functional material, and light transmittance of the multi-functional material is greater than 85% for 400 nanometers to 760 nanometers light wavelength.

Optionally, in some embodiments of the present application, the viscosity of the multi-functional material ranges from 10 centipoises to 30 centipoises.

Optionally, in some embodiments of the present application, the multi-functional material is an organic material.

Optionally, in some embodiments of the present application, the multi-functional material has a bending property better than indium tin oxide (ITO).

Optionally, in some embodiments of the present application, the OLED display panel further includes a pixel definition layer disposed at a side of the multi-functional layer away from the array substrate, wherein the pixel definition layer includes organic patterns disposed at intervals, and the light emitting layer is disposed between adjacent organic patterns.

Optionally, in some embodiments of the present application, the light emitting layer is disposed corresponding to the conductive portion.

Optionally, in some embodiments of the present application, the array substrate is further provided with a color resist layer including red color resists, blue color resists and green color resists disposed at intervals, and an orthographic projection of the light emitting layer onto a substrate covers an orthographic projection of the color resist layer onto the substrate.

Optionally, in some embodiments of the present application, the red color resists, the blue color resists and the green color resists are disposed corresponding to the conductive portions, respectively.

Optionally, in some embodiments of the present application, the light emitting layer is disposed on entire surface, and the cathode is disposed on entire surface.

Optionally, in some embodiments of the present application, the OLED display panel has no pixel definition layer.

Optionally, in some embodiments of the present application, a light reflecting layer is disposed on the array substrate, and the conductive portions are disposed on the light reflecting layer.

Optionally, in some embodiments of the present application, the light reflecting layer includes a reflective material having a reflecting power higher than the material of the cathode.

Embodiments of the present application provide a method of manufacturing an OLED display panel, including:
  providing an array substrate;
  depositing a layer of multi-functional material on the array substrate to obtain a multi-functional material layer, and performing a conduction processing on the multi-functional material layer using a first solution under a second condition to manufacture a multi-functional layer including a plurality of conductive portions disposed at intervals and non-conductive portions;
  manufacturing a light emitting layer at a side of the multi-functional layer away from the array substrate; and
  manufacturing a cathode at a side of the light emitting layer away from the array substrate.

Optionally, in some embodiments of the present application, the step of manufacturing the multi-functional layer further includes: performing the conduction processing on the multi-functional material layer by using a first mask to manufacture the conductive portions and the non-conductive portions of the multi-functional layer.

Optionally, in some embodiments of the present application, the step of manufacturing the multi-functional layer further includes: manufacturing a photoresist pattern on the multi-functional material layer, shielding the multi-functional material layer by using the photoresist pattern to make the multi-functional material layer become conductive/insulated to manufacture the conductive portions and the non-conductive portions of the multi-functional layer, and then peeling off the photoresist pattern.

Optionally, in some embodiments of the present application, the step of manufacturing the light emitting layer on the multi-functional layer includes: manufacturing a pixel definition layer at a side of the multi-functional layer away from the array substrate, wherein the pixel definition layer includes organic patterns disposed at intervals; and manufacturing the light emitting layer between adjacent organic patterns by ink printing/evaporation.

Beneficial Effects

The multi-functional layer is disposed on the array substrate. The multi-functional layer includes the conductive portions and the non-conductive portions. The multi-functional layer replaces the existing flattening layer and anode. One end of the conductive portions is electrically connected to the light emitting layer, and the other end of the conductive portions is electrically connected to the source. Since the conductive portions and the non-conductive portions are located at a same layer and are coplanar, at least one mask is reduced and the cost is lowered. This alleviates the problems that the existing OLED display panels have a large number of masks and are high in cost.

DESCRIPTION OF DRAWINGS

For explaining the technical solutions used in the embodiments of the present application more clearly, the appended figures to be used in describing the embodiments will be briefly introduced in the following. Obviously, the appended figures described below are only some of the embodiments of the present application, and those of ordinary skill in the art can further obtain other figures according to these figures without making any inventive effort.

Figure 1:
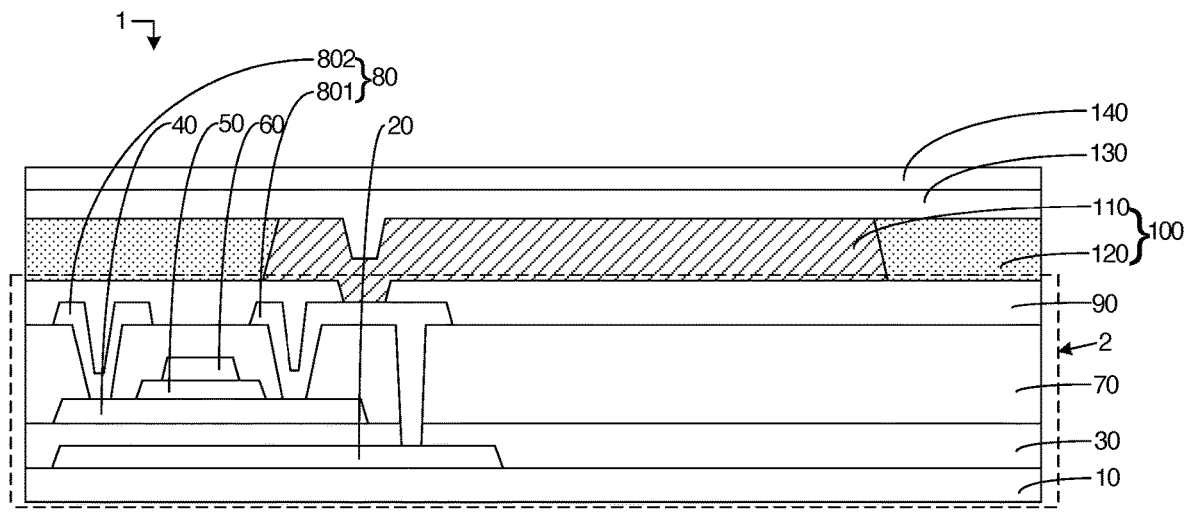
FIG. 1 is a first type of schematic cross-sectional view of an OLED display panel provided in an embodiment of the present application.

Description on refence numbers:

| Reference number | Name of elements | Reference number | Name of elements |
|---|---|---|---|
| 1 | OLED display panel | 2 | an array substrate |
| 10 | substrate | 20 | light shielding layer |

-continued

Description on refence numbers:

| Reference number | Name of elements | Reference number | Name of elements |
|---|---|---|---|
| 30 | buffer layer | 40 | active layer |
| 50 | gate insulating layer | 60 | gate electrode layer |
| 70 | insulating interlayer | 80 | source drain electrode layer |
| 90 | passivation layer | 100 | multi-functional layer |
| 110 | conductive portion | 120 | non-conductive portion |
| 130 | light emitting layer | 140 | cathode |
| 150 | light reflecting layer | 801 | source |
| 802 | drain | | |

DESCRIPTION OF EMBODIMENTS OF THE DISCLOSURE

The technical solutions in the embodiments of the present application are clearly and completely described below with reference to appending drawings of the embodiments of the present application. Obviously, the described embodiments are merely a part of embodiments of the present application and are not all of the embodiments. Based on the embodiments of the present application, all the other embodiments obtained by those of ordinary skill in the art without making any inventive effort are within the scope the present application. In addition, it should be understood that the specific embodiments described herein are merely for illustrating and interpreting the present application and the present application is not limited thereto. In the present application, direction words used herein, such as "upper" and "lower", generally refer to the upper and lower of a device under an actual use or operation state, as the directions shown in the drawings, unless otherwise specified; "inner" and "outer" are for the contour of the device.

Referring to FIG. 1, the present application provides an organic light emitting diode (OLED) display panel 1, which includes an array substrate 2, a multi-functional layer 100, a light emitting layer 130 and a cathode 140. The array substrate 2 includes a source 801 and a drain 802 that are disposed at a same layer. The multi-functional layer 100 is disposed above the array substrate 2. The light emitting layer 130 is disposed on the multi-functional layer 100. The cathode 140 is disposed on the light emitting layer 130. The multi-functional layer 100 includes a plurality of conductive portions 110 disposed at intervals and non-conductive portions 120. One end of the conductive portions 110 is electrically connected to the light emitting layer 130, and the other end of the conductive portions 110 is electrically connected to the source 801.

In the present application, the multi-functional layer 100 is disposed on the array substrate 2. The multi-functional layer 100 includes the conductive portions 110 and the non-conductive portions 120. The multi-functional layer 100 replaces the existing flattening layer and anode, that is, the multi-functional layer not only functions as the flattening layer but also functions as the anode. One end of the conductive portions 110 is electrically connected to the light emitting layer 130, and the other end of the conductive portions 110 is electrically connected to the source 801. Since the conductive portions 110 and the non-conductive portions 120 are located at a same layer and are coplanar, at least one mask is reduced and the cost is lowered.

If each of the light emitting layer and the cathode is disposed on entire surface, there is no need to dispose a pixel definition layer at a side of the multi-functional layer away from the array substrate. Thus, a mask may be further reduced. That is, the conductive portions 110 and the non-conductive portions 120 are disposed at a same layer and are coplanar, and the pixel definition layer is omitted. This can reduce two masks and the cost is lowered. In addition, since there is no need to dispose the pixel definition layer, the overall thickness of film layers is also reduced.

It can be understood that if the light emitting layer is disposed on entire surface, it can prevent the anode and the cathode from connecting to each other, thereby preventing an electrical short-circuit caused by connecting the anode and the cathode to each other.

The array substrate 2 includes a substrate 10, a light shielding layer 20 disposed on the substrate 10, a buffer layer 30 disposed on the light shielding layer 20, an active layer 40 disposed on the buffer layer 30, a gate insulating layer 50 disposed on the active layer 40, a gate electrode layer 60 disposed on the gate insulating layer 50, an insulating interlayer 70 disposed on the gate electrode layer 60, a layer 80 of source and drain 802 disposed on the insulating interlayer 70 and a passivation layer 90 disposed on the layer 80 of source and drain 802.

The technical solutions of the present application will be described with reference to embodiments as follows.

In an embodiment, the conductive portions 110 and the non-conductive portions 120 are disposed at a same layer.

The passivation layer 90 includes a via hole penetrating the passivation layer 90. The conductive portion 110 covers the via hole.

The conductive portion 110 is connected to the source 801 through the via hole.

In the present embodiment, the conductive portions 110 and the non-conductive portions 120 are disposed at a same layer, and the conductive portions 110 and the non-conductive portions 120 can be manufactured in a same process, thereby reducing a use of mask.

Figure 2:
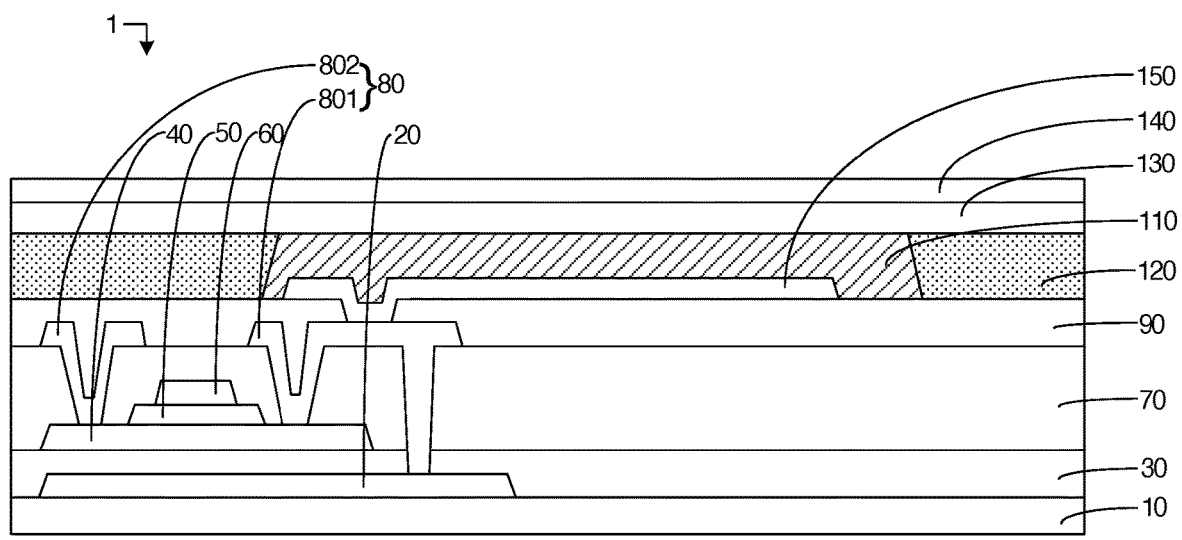
FIG. 2 is a second type of schematic cross-sectional view of an OLED display panel provided in an embodiment of the present application.

In an embodiment, referring to FIG. 2, a light reflecting layer 150 is disposed on the array substrate 2, the conductive portions 110 are disposed on the light reflecting layer 150, and the light reflecting layer 150 is connected to the source 801.

The OLED display panel 1 is of a top-emitting type, and light emits at a side of the light emitting layer 130 away from the substrate 10.

The light reflecting layer 150 includes a reflective material having a reflecting power higher than the material of the cathode 140.

In the present embodiment, the multi-functional layer 100 is disposed on the array substrate 2. The solution with a use of the conductive portions 110 and the non-conductive portions 120 included in the multi-functional layer 100 is also applicable to the top-emitting OLED display panel 1, extending the reach of applications of the multi-functional layer 100.

In an embodiment, the light emitting layer 130 is a white light emitting layer 130, the array substrate 2 is further provided with a color resist layer including red color resists, blue color resists and green color resists disposed at intervals, and an orthographic projection of the light emitting layer 130 onto the substrate 10 covers an orthographic projection of the color resist layer onto the substrate 10. The red color resists, the blue color resists and the green color resists are disposed corresponding to the conductive portions 110, respectively.

The OLED display panel 1 is a large-scale display panel. Specifically, the size of the OLED display panel 1 can be larger than or equal to 55 inches.

In an embodiment, the light emitting layer 130 of the OLED display panel 1 can be manufactured by evaporation. There is no pixel definition layer disposed in the OLED display panel 1. The light emitting layer 130 is disposed on the multi-functional layer 100.

In another embodiment, the light emitting layer 130 of the OLED display panel 1 is manufactured by ink printing. The OLED display panel 1 further includes a pixel definition layer including organic patterns disposed at intervals, and the white light emitting layer 130 is disposed between adjacent organic patterns.

In an embodiment, the material of the multi-functional layer 100 includes a multi-functional material, wherein under a first condition, the multi-functional layer is an insulating material, and under a second condition, the multi-functional layer is conductive after reacting with a first solution.

It can be understood that the first condition can be room temperature under one atmosphere of pressure, that is, the multi-functional material can be an insulating material in normal state.

It can be understood that the second condition can be a preset condition that can be determined based on actual needs. Under the preset condition, the multi-functional material reacts with the first solution to make the multi-functional material become conductive.

Furthermore, the multi-functional material can be a conductive material in normal state. Under a third condition, the multi-functional material reacts with a second solution to make the multi-functional material have an insulating property. Specifically, the third condition and the second solution can be selected based on actual needs, or can be obtained or acquired directly by a purchase.

In an embodiment, the material of the multi-functional layer 100 includes a multi-functional material, and light transmittance of the multi-functional material is greater than 85% for 400 nanometers to 760 nanometers light wavelength.

The multi-functional material has high transmittance mainly for blue light.

In the present embodiment, the light transmittance of the multi-functional material is greater than 85% for 400 nanometers to 760 nanometers light wavelength such that light emitting efficiency of the OLED display panel is improved.

In an embodiment, the viscosity of the multi-functional material ranges from 10 centipoises to 30 centipoises.

In an embodiment, the OLED display panel 1 further includes a pixel definition layer disposed on the multi-functional layer 100. The pixel definition layer includes organic patterns disposed at intervals, and the light emitting layer 130 is disposed between adjacent organic patterns.

In an embodiment, the light emitting layer is disposed corresponding to the conductive portion.

In an embodiment, the multi-functional material is an organic material.

It can be understood that the multi-functional material has a bending property better than the material of the anode, that is, indium tin oxide (ITO).

During a test on the bending property, the display panel with an anode made of ITO is easy to be cracked, and by a detection, its measured impedance becomes large. However, during a test on the bending property, the impedance of the multi-functional material remains unchanged. It can be proved that a bent multi-functional material has a smaller number of cracks or with no cracks. This can tell the flexibility of the multi-functional material is better than the flexibility of the ITO.

It needs to be noted that bending tests are performed on the ITO and the multi-functional material, the impedance of the ITO and the multi-functional material is measured under a same condition on the bending, and it can be determined the magnitudes of flexibility of the multi-functional material and the ITO by observing the size of impedance and its changes.

Figure 3:
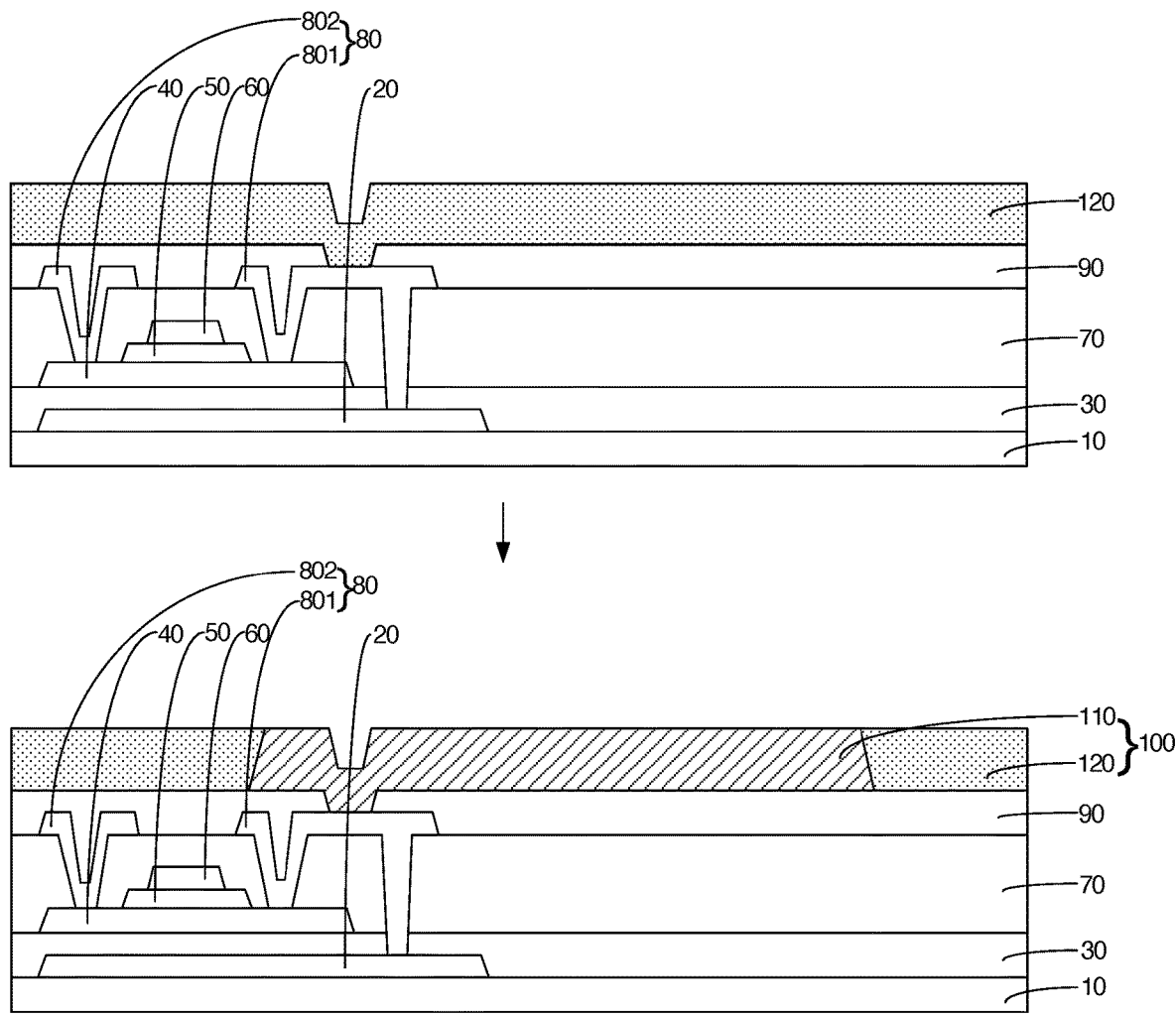
FIG. 3 is a schematic cross-sectional view showing a method of manufacturing an OLED display panel provided in an embodiment of the present application.
Figure 4:
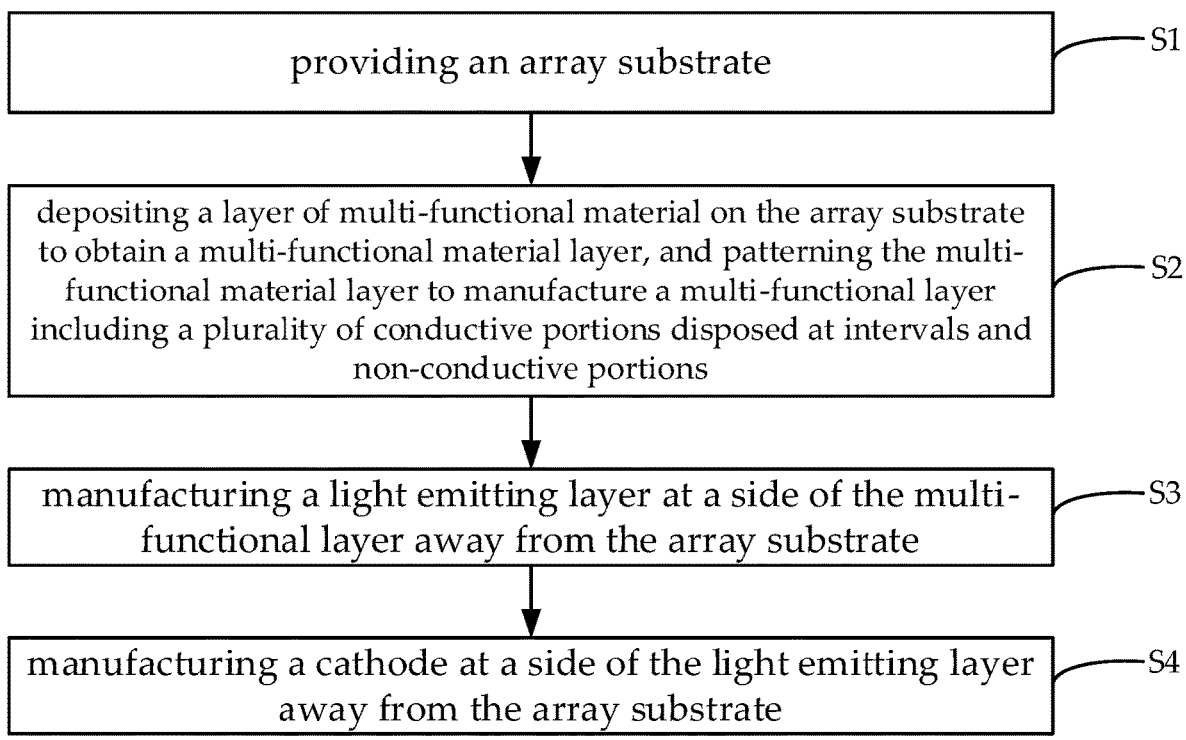
FIG. 4 is a flowchart of a method of manufacturing an OLED display panel provided in the present application.

Referring to FIG. 3 and FIG. 4, in the present embodiment, the flexibility of the multi-functional material is higher than the flexibility of the ITO, reducing the number of cracks generated during the OLED display panel is bending.

The method of manufacturing the OLED display panel provided in embodiments of the present application includes:

S1: providing an array substrate;

S2: depositing a layer of multi-functional material on the array substrate 2 to obtain a multi-functional material layer, and performing a conduction processing on the multi-functional material layer using a first solution under a second condition to manufacture a multi-functional layer 100 including a plurality of conductive portions 110 disposed at intervals and non-conductive portions 120;

S3: manufacturing a light emitting layer 130 at a side of the multi-functional layer 100 away from the array substrate 2;

A cathode is manufactured at a side of the light emitting layer away from the array substrate.

S4: manufacturing a cathode 140 at a side of the light emitting layer 130 away from the array substrate 2.

The conductive portions 110 and the non-conductive portions 120 are disposed at a same layer.

The array substrate 2 includes a substrate 10, a light shielding layer 20 disposed on the substrate 10, a buffer layer 30, an active layer 40, a gate insulating layer 50, a gate electrode layer 60, an insulating interlayer 70, a layer 80 of source and drain 802 and a passivation layer 90.

The layer 80 of source and drain 802 includes a source 801 and a drain 802.

One end of the conductive portions 110 is electrically connected to the source 801, and the other end of the conductive portions is electrically connected to light emitting layer 130.

It can be understood that when the light emitting layer 130 is manufactured by ink printing, the OLED display panel 1 includes a pixel definition layer including organic patterns disposed at intervals for restricting the light emitting material from crossing the organic patterns to cause a color crosstalk.

It needs to be noted that after a layer of multi-functional material is deposited on the array substrate 2 to obtain the multi-functional material, it further needs to pattern some areas of a non-display region to make the multi-functional material layer hollow out to expose something beneath it at the positions of a packing headroom area, a cutting channel, a chip on film (COF) area, and etc.

Specifically, referring to FIG. 3, the passivation layer 90 of the array substrate 2 is provided with a via hole penetrating the passivation layer 90. A layer of multi-functional material is deposited on the passivation layer 90 to obtain a multi-functional material layer. A conduction/insulating processing is performed on the multi-functional material layer to manufacture the conductive portions 110 and the non-conductive portions 120.

In an embodiment, the step of manufacturing the multi-functional layer 100 further includes: patterning the multi-functional material layer by using a first mask to manufacture the conductive portions 110 and the non-conductive portions 120 of the multi-functional layer 100.

When the multi-functional material is a conductive material, it can perform an insulating processing on some areas to obtain the conductive portions 110 and the non-conductive portions 120.

When the multi-functional material is an insulating material, it can perform a conduction processing on some areas to obtain the conductive portions 110 and the non-conductive portions 120.

It can be understood that when the multi-functional material is a conductive material, a first mask can be employed to manufacture the conductive portions 110 and the non-conductive portions 120. Opening areas of the first mask correspond to the non-conductive portions 120. The non-conductive portions 120 are obtained by using the first mask to perform an insulating processing on the multi-functional material.

It can be understood that when the multi-functional material is a conductive material, a second mask can be employed to manufacture the conductive portions 110 and the non-conductive portions 120. Opening areas of the second mask correspond to the conductive portions 110. The conductive portions 110 are obtained by using the second mask to perform a conduction processing on the multi-functional material.

It needs to be noted that the function of the conductive portions 110 is as same as the function of the anode, and the function of the non-conductive portions 120 is as same as the flattening layer.

In the present embodiment, by employing the first mask/the second mask to manufacture the conductive portions 110 and the non-conductive portions 120 from the multi-functional material layer, one mask can be saved and the conductive portions 110 and the non-conductive portions 120 are manufactured in a single process.

In an embodiment, the step of manufacturing the multi-functional layer 100 further includes: manufacturing a photoresist pattern on the multi-functional material layer, shielding the multi-functional material layer by using the photoresist pattern to make the multi-functional material layer become conductive/insulated to manufacture the conductive portions 110/the non-conductive portions 120 of the multi-functional layer 100, and then peeling off the photoresist pattern.

The photoresist pattern is employed to shield the multi-functional material, thereby obtaining the conductive portions 110 and the non-conductive portions 120.

A third mask is employed to pattern a photoresist material to manufacture the photoresist pattern, and then the photoresist pattern is used to shield the multi-functional material. The photoresist pattern is removed after the conductive portions 110 and the non-conductive portions 120 are manufactured.

In an embodiment, the step of manufacturing the light emitting layer 130 on the multi-functional layer 100 includes: manufacturing a pixel definition layer on the multi-functional layer 100; and manufacturing the light emitting layer 130 between adjacent pixel definition layer by ink printing/evaporation.

When the light emitting layer 130 is manufactured by the ink printing, it needs to manufacture a pixel definition layer in advance, and then the ink printing is performed on an area between adjacent pixel definition layer to manufacture the light emitting layer 130.

In an embodiment, when the light emitting layer 130 is manufactured by the evaporation, there is no need to manufacture the pixel definition layer.

A fourth mask can be employed in the process of evaporation to obtain the light emitting layer 130. Opening areas of the fourth mask corresponds to a pattern of the light emitting layer 130.

In the present embodiment, the light emitting layer 130 is manufactured directly by the fourth mask such that there is no need to deploy the pixel definition layer. This can reduce the overall thickness of the OLED display panel 1.

The OLED display panel provided in the present embodiment includes the array substrate, the multi-functional layer, the light emitting layer and the cathode. The array substrate includes the source and the drain that are disposed at a same layer. The multi-functional layer is disposed above the array substrate. The light emitting layer is disposed on the multi-functional layer. The cathode is disposed on the light emitting layer. The multi-functional layer includes a plurality of conductive portions disposed at intervals and non-conductive portions. One end of the conductive portions is electrically connected to the light emitting layer, and the other end of the conductive portions is electrically connected to the source. The conductive portions and the non-conductive portions are disposed at a same layer and are coplanar such that at least one mask is reduced and the cost is lowered.

In the above embodiments, different emphasis is placed on respective embodiments, and reference may be made to related depictions in other embodiments for portions not detailed in a certain embodiment.

The OLED display panel and the method of manufacturing the OLED display panel provided in the embodiments of the present application are described in detail above. The principle and implementation of the present application are described herein through specific examples. The description about the embodiments of the present application is merely provided to help understanding the method and core ideas of the present application. In addition, persons of ordinary skill in the art can make variations and modifications to the present application in terms of the specific implementations and application scopes according to the ideas of the present application. Therefore, the content of specification shall not be construed as a limit to the present application.

The invention claimed is:

1. An organic light emitting diode (OLED) display panel, comprising:
   array substrate, comprising a source and a drain that are disposed at a same layer;
   a multi-functional layer, disposed above the array substrate;
   a light emitting layer, disposed at a side of the multi-functional layer away from the array substrate; and
   a cathode, disposed at a side of the light emitting layer away from the array substrate,
   wherein the multi-functional layer comprises a plurality of conductive portions and non-conductive portions disposed at intervals, the conductive portions and the non-conductive portions are disposed at a same layer and are coplanar, one end of the conductive portions is electrically connected to the light emitting layer, and the other end of the conductive portions is electrically connected to the source.

2. The OLED display panel of claim 1, wherein the light emitting layer is disposed corresponding to the conductive portions.

3. The OLED display panel of claim 1, wherein the array substrate is further provided with a color resist layer comprising red color resists, blue color resists and green color resists disposed at intervals, and an orthographic projection of the light emitting layer onto a substrate covers an orthographic projection of the color resist layer onto the substrate.

4. The OLED display panel of claim 3, wherein the red color resists, the blue color resists and the green color resists are disposed corresponding to the conductive portions, respectively.

5. The OLED display panel of claim 1, wherein the light emitting layer is disposed on entire surface, and the cathode is disposed on entire surface.

6. The OLED display panel of claim 1, wherein a light reflecting layer is disposed on the array substrate, and the conductive portions are disposed on the light reflecting layer.

7. The OLED display panel of claim 6, wherein the light reflecting layer comprises a reflective material having a reflecting power higher than a material of the cathode.

8. A method of manufacturing an organic light emitting diode (OLED) display panel, comprising:
   providing an array substrate;
   manufacturing a multi-functional layer on the array substrate, wherein the multi-functional layer comprises a plurality of conductive portions and non-conductive portions disposed at intervals, and the conductive portions and the non-conductive portions are disposed at a same layer and are coplanar;
   manufacturing a light emitting layer at a side of the multi-functional layer away from the array substrate; and
   manufacturing a cathode at a side of the light emitting layer away from the array substrate.

9. The method of manufacturing an organic light emitting diode (OLED) display panel of claim 8, wherein the light emitting layer is disposed corresponding to the conductive portions.

10. The method of manufacturing an organic light emitting diode (OLED) display panel of claim 8, wherein the array substrate is further provided with a color resist layer comprising red color resists, blue color resists and green color resists disposed at intervals, and an orthographic projection of the light emitting layer onto a substrate covers an orthographic projection of the color resist layer onto the substrate.

11. The method of manufacturing an organic light emitting diode (OLED) display panel of claim 10, wherein the red color resists, the blue color resists and the green color resists are disposed corresponding to the conductive portions, respectively.

12. The method of manufacturing an organic light emitting diode (OLED) display panel of claim 8, wherein the light emitting layer is disposed on entire surface, and the cathode is disposed on entire surface.

13. The method of manufacturing an organic light emitting diode (OLED) display panel of claim 8, wherein a light reflecting layer is disposed on the array substrate, and the conductive portions are disposed on the light reflecting layer.

14. The method of manufacturing an organic light emitting diode (OLED) display panel of claim 13, wherein the light reflecting layer comprises a reflective material having a reflecting power higher than a material of the cathode.

15. The OLED display panel of claim 6, wherein the light reflecting layer is connected to the source.

16. The organic light emitting diode (OLED) display panel of claim 1, wherein the array substrate comprises a substrate.

17. The OLED display panel of claim 16, wherein the OLED display panel is of a top-emitting type, and light emits at a side, away from the substrate, of the light emitting layer.

18. The organic light emitting diode (OLED) display panel of claim 16, wherein a buffer layer, an active layer, a gate insulating layer, a gate electrode layer, and an insulating interlayer are disposed on the substrate.

19. The organic light emitting diode (OLED) display panel of claim 16, wherein the source and drain are disposed on the insulating interlayer.

20. The organic light emitting diode (OLED) display panel of claim 16, wherein the array substrate further comprises a passivation layer disposed on the source and the drain.

* * * * *